United States Patent
Choi

(10) Patent No.: US 7,348,819 B2
(45) Date of Patent: Mar. 25, 2008

(54) DELAY LOCKED LOOP CIRCUIT

(75) Inventor: Hoon Choi, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 62 days.

(21) Appl. No.: 11/477,527

(22) Filed: Jun. 30, 2006

(65) Prior Publication Data

US 2007/0069772 A1 Mar. 29, 2007

(30) Foreign Application Priority Data

Sep. 29, 2005 (KR) .................. 10-2005-0091671
Dec. 2, 2005 (KR) .................. 10-2005-0117122

(51) Int. Cl.
*H03L 7/06* (2006.01)
(52) U.S. Cl. .................... 327/158; 327/149
(58) Field of Classification Search ............ None
See application file for complete search history.

(56) References Cited

U.S. PATENT DOCUMENTS

| | | | | |
|---|---|---|---|---|
| 6,031,429 | A * | 2/2000 | Shen ................... | 331/17 |
| 6,198,689 | B1 * | 3/2001 | Yamazaki et al. ........ | 365/233 |
| 6,342,801 | B1 * | 1/2002 | Shin .................... | 327/175 |
| 6,456,130 | B1 * | 9/2002 | Schnell ................. | 327/156 |
| 6,650,594 | B1 | 11/2003 | Lee et al. | |
| 6,741,507 | B2 * | 5/2004 | Iwamoto ............... | 365/194 |
| 6,825,703 | B1 | 11/2004 | Kwak | |
| 6,836,437 | B2 | 12/2004 | Li et al. | |
| 7,046,061 | B2 * | 5/2006 | Kwak ................... | 327/158 |
| 2004/0042282 | A1 | 3/2004 | Li et al. | |
| 2005/0060487 | A1 | 3/2005 | Barth et al. | |
| 2005/0093599 | A1 | 5/2005 | Kwak | |
| 2007/0069773 | A1 * | 3/2007 | Choi ................... | 327/158 |
| 2007/0069777 | A1 * | 3/2007 | Kim .................... | 327/158 |
| 2007/0070731 | A1 * | 3/2007 | Choi ................... | 365/194 |

FOREIGN PATENT DOCUMENTS

| | | |
|---|---|---|
| JP | 11-185470 A | 7/1999 |
| JP | 2005-20686 A | 1/2005 |
| KR | 1999-0053733 | 7/1999 |

* cited by examiner

*Primary Examiner*—Cassanadra Cox
(74) *Attorney, Agent, or Firm*—McDermott Will & Emery LLP

(57) ABSTRACT

A DLL circuit and a synchronous memory device perform stable operation in a power down mode although the entry and exit into/from the power down mode is repeated rapidly. The synchronous memory device operates in a normal mode and a power down mode. A delay locked loop (DLL) generates a DLL clock having frozen locking information when exiting the power down mode. A controller precludes phase update operation of the DLL when a predetermined time passes after entering the power down mode to thereby obtain a time margin for a phase update operation undertaken in the normal mode.

20 Claims, 11 Drawing Sheets

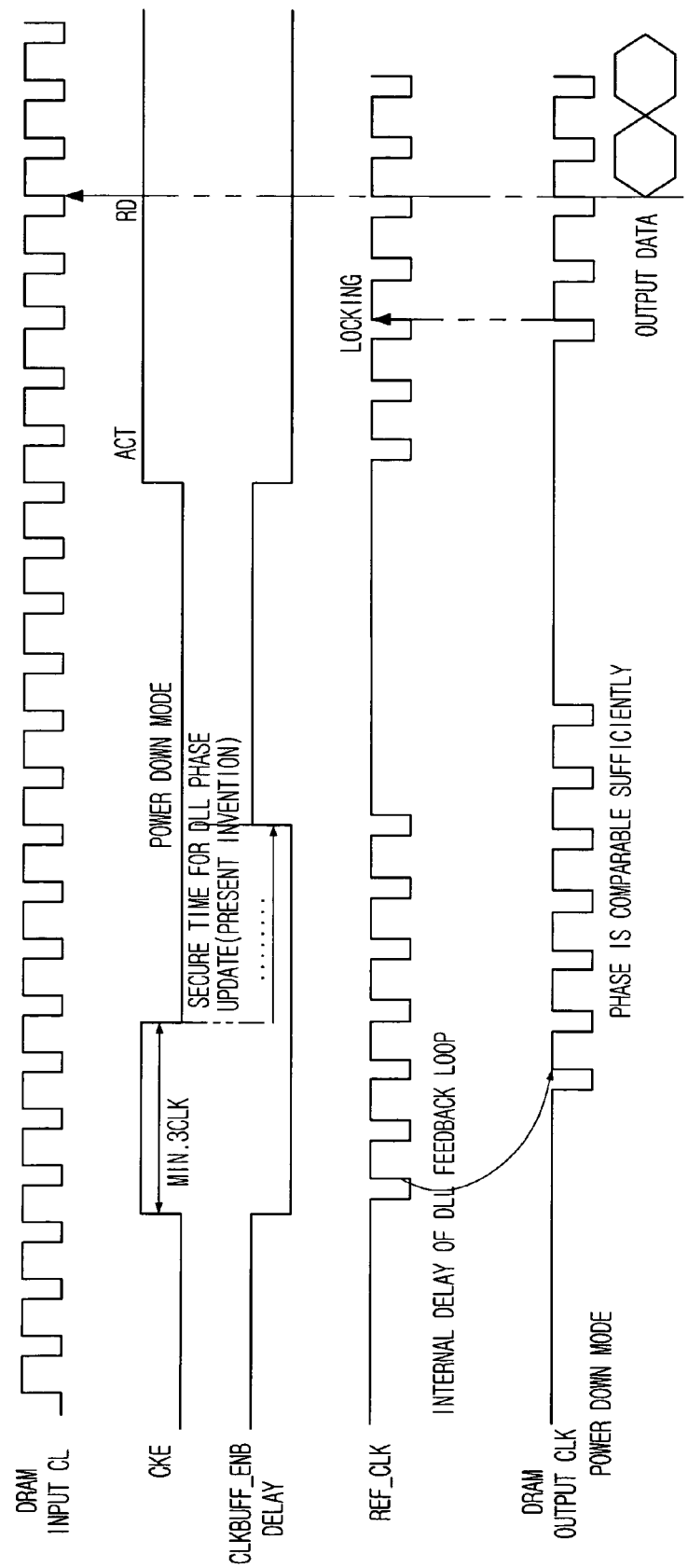

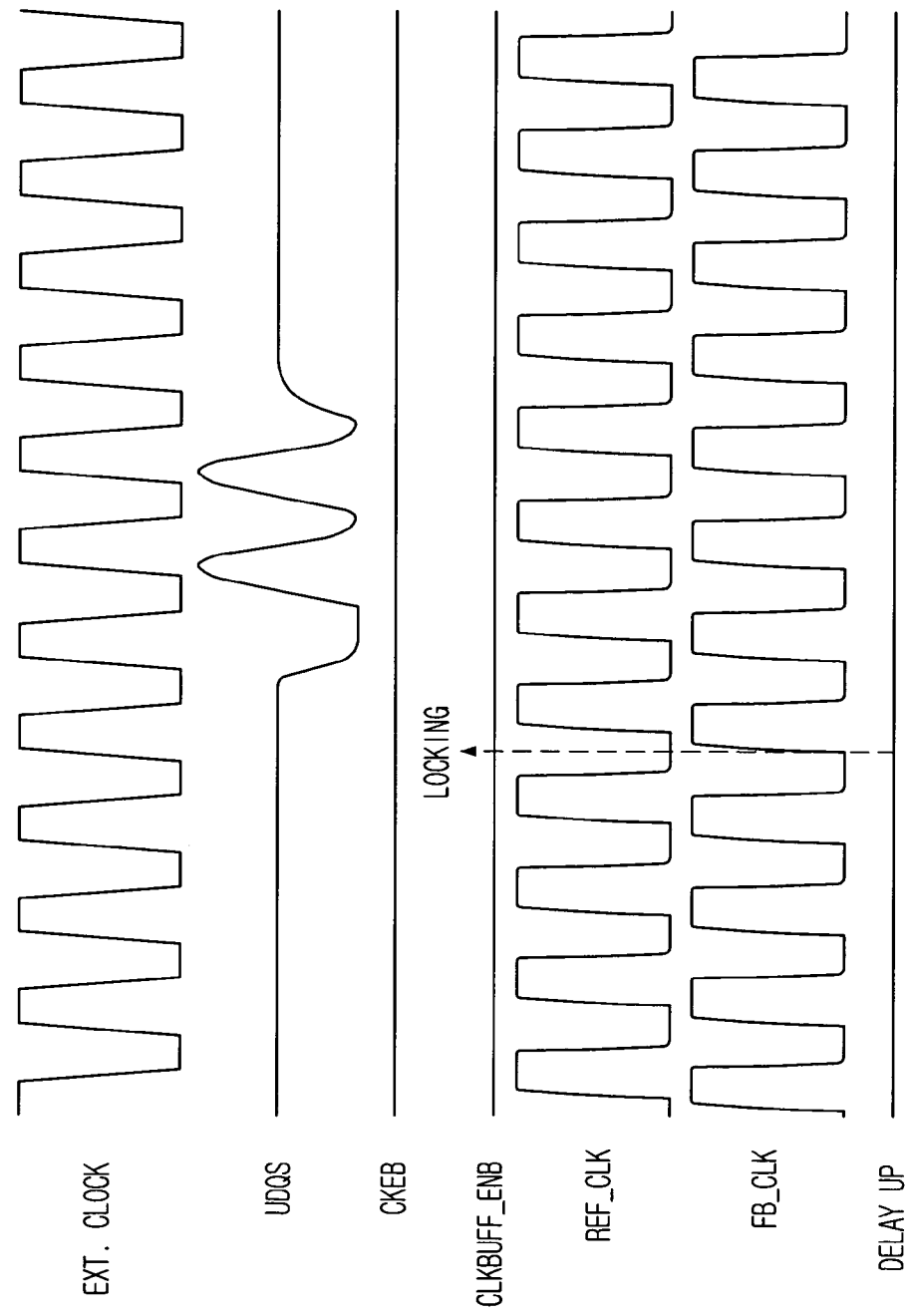

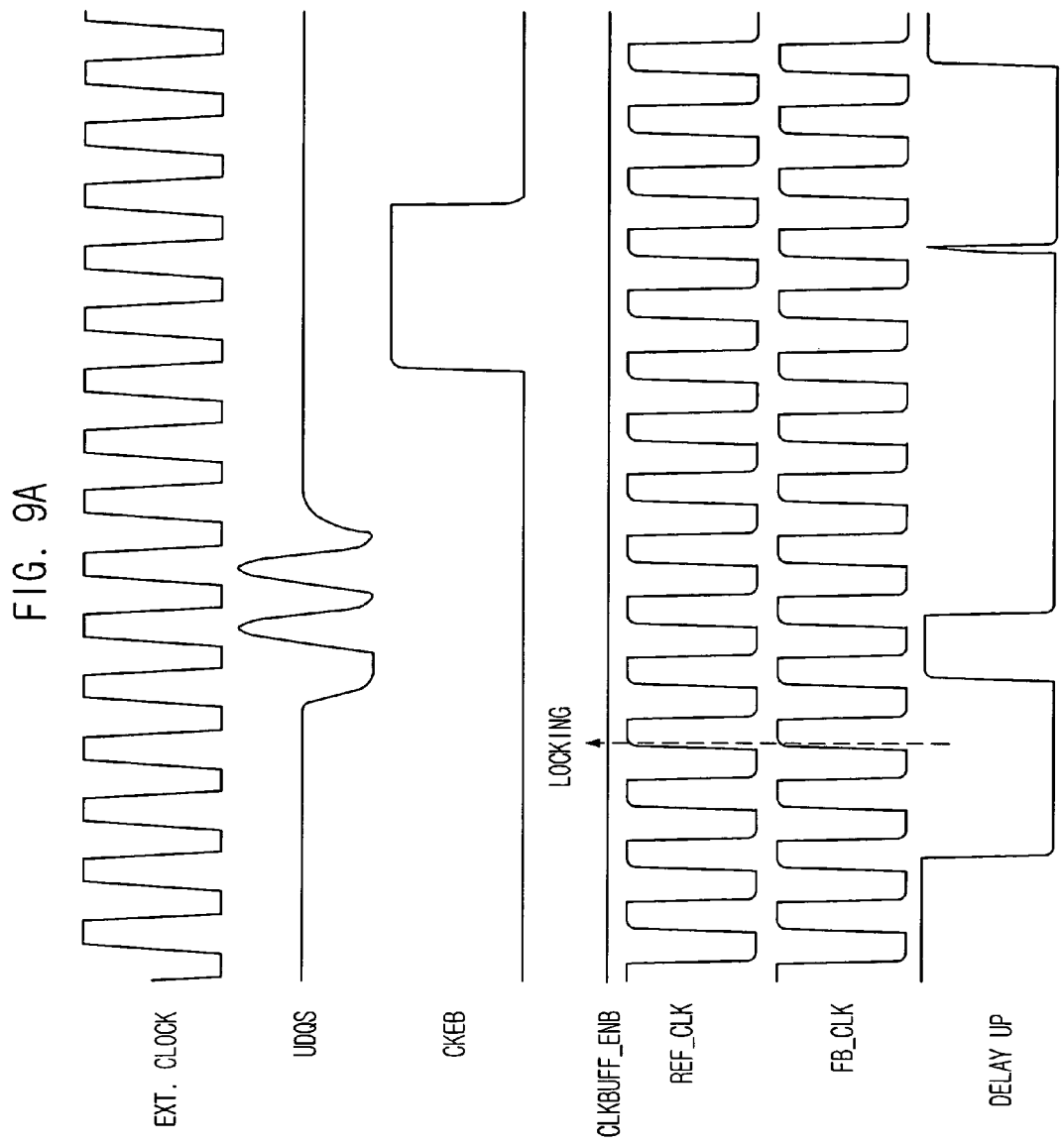

DELAY LOCKED LOOP CIRCUIT

FIELD OF THE INVENTION

The present invention relates to a delay locked loop (DLL) circuit of a synchronous DRAM; and, more particularly, to a DLL circuit for performing a stable operation in a power down mode for low power operation of a semiconductor device.

DESCRIPTION OF RELATED ARTS

A synchronous semiconductor memory device such as a double data rate synchronous DRAM (DDR SDRAM) performs data transmission with external devices using an internal clock signal locked in synchronization with an external clock signal inputted from an external device such as a memory controller. Time synchronization between a reference clock signal and data is important for stably transmitting the data between a memory device and a memory controller. In order to transmit the data stably, the data should be positioned accurately at an edge or a center of the clock by compensating for delay time which occurs inevitably by virtue of the time difference between the data transmission of each element and the data's being loaded into a bus.

A clock synchronous circuit for compensating the delay time is a phase locked loop (PLL) or a delay locked loop (DLL). If the external clock signal is different in frequency from an internal clock signal, it is necessary to employ a frequency multiplying function. Thus, the PLL is mainly used in this case. On the contrary, if the external clock signal is equal in frequency to the internal clock signal, the DLL is used. The DLL circuit generates the internal clock signal by compensating for a clock delay component which occurs while the clock signal passing through each element is transmitted to a data output terminal inside the semiconductor memory device. Accordingly, the DLL circuit enables the clock signal used for finally in/outputting the data to be synchronized with the external clock signal. The DLL circuit has advantages in that noise is low and it can be embodied within a small area, in comparison with the PLL circuit. Therefore the DLL circuit generally is used as a synchronous circuit in the semiconductor memory device. Among various kinds of DLLs, recent technology provides a register controlled DLL circuit capable of reducing time which is taken in locking a first clock.

The register controlled DLL circuit has a register capable of storing a locked delay value, stores the locked delay value in the register when a power is interrupted, and loads the locked delay value stored in the register when the power is turned on again so that the locked delay value is instantly used for locking the clock.

FIG. 1 is a timing diagram illustrating basic operation of a typical delay locked loop (DLL).

The DLL receives an external clock signal and compensates for a delay amount by which an internal clock of the DRAM is delayed. The DLL ensures that an output signal of the DRAM is in phase with the external clock signal. When the external clock and the output of the DRAM have the same phase, the data may be transferred to a chipset without error.

FIG. 2 is a block diagram of a known DLL circuit. FIG. 2 is based on a register controlled DLL circuit.

The DLL circuit includes a clock buffer 10, a power down mode controller 20, a phase comparator 30, a delay controller 40, a delay line 50, a dummy delay line 60, and a delay replica model 70. An output clock CLK_DLL of the DLL circuit is transferred to an output buffer 90 through a clock signal line 80 to control output timing of the data.

The clock buffer 10 generates an internal clock signal REF_CLK by receiving an external clock signal CLK and an external clock bar signal CLKB and buffering it.

The power down mode controller 20 turns off the clock buffer 10 when the DRAM enters a power down mode. For low power operation of the DRAM when there is no read/write operation, the DRAM enters the power down mode as a clock enable signal CKE becomes a logic level 'LOW'. At this time, because the clock buffer 10 does not generate the internal clock signal REF_CLK, the clock buffer 10 is turned off to save a current state of the DLL.

The phase comparator 30 detects a phase difference between input and output clocks of the DLL by comparing phases of the input and output clocks with each other. Typically, in order to reduce power consumption of the DLL, the frequency of the external clock is divided into a predetermined frequency through a divider and then the divided clock is compared at the phase comparator 30. In FIG. 2, wherein for the sake of illustrative convenience the divider is omitted, the internal clock signal REF_CLK passing through the clock buffer 10 and a feedback clock signal FEEDBACK CLOCK fed back after passing through the internal circuit are compared with each other at the phase comparator 30. The phase comparator 30 controls the delay controller 40 on the basis of the comparison result.

The delay controller 40 is configured with logic determining an input path of the delay line 50 and a bi-directional shift register for shifting the direction of the path. The shift register, which receives four input signals and performs a shifting operation, has a maximum or minimum delay by making its initial input condition such that its most right signal or most left signal is in a logic level 'HIGH'. The signals input to the shift register have two shift right signals, and two shift left signals. For shift operation, two of the signals in a logic level 'HIGH' should not overlap each other.

The delay line 50 delays the phase of the external clock. The amount of the delay is determined by the phase comparator 30. In addition, the delay line 50 determines a delay path that determines the phase delay under control of the delay controller 40. The delay line 50 includes a number of unit delay cells that are serially coupled to each other. Each of the unit delay cells includes two NAND gates that are serially coupled to each other. The input of each of the unit delay cells is connected to the shift register in the delay controller 40 in one-to-one mapping. The region in which the output of the shift register becomes a logic level 'HIGH' is determined as a path through which the clock passing through the clock buffer 10 is inputted. The delay line 50 is constructed with two delay lines of one delay line for the rising clock and the other delay line for the falling clock in the DDR SDRAM to suppress duty ratio distortion as much as possible by identically processing the rising edge and the falling edge.

The dummy delay line 60 is a delay line for generating a feedback clock signal FEEDBACK CLOCK applied to the phase comparator 30. The dummy delay line 60 is identical to the delay line 50 as illustrated above.

The delay replica model 70 is a circuit for modeling the delay factors that affect clock timing from input to the chip of the external clock, through delay line 50, until clock output from the chip. The accurate delay factors determine the deterioration value in the function of the DLL circuit.

The delay replica model 70 models the clock buffer, the DLL clock driver, the R/F divider, and the output buffer.

The clock signal line 80 is a path in which the output clock CLK_DLL of the DLL is transferred to the output buffer 90.

The output buffer 90 receives the data from a memory core and outputs the data to a data output pad in synchronization with the output clock CLK_DLL of the DLL.

FIG. 3 is a timing diagram for operation of the DLL of FIG. 2.

As shown, when entering a power down mode, the clock enable signal CKE transitions from a logic level 'HIGH' to a logic level 'LOW'. At this time, the DLL circuit stops performing a phase update in order to save the current state, and stores previously locked information to enter a frozen state. Herein, the term phase update means that the feedback clock signal FEEDBACK CLOCK of the DLL circuit is compared in phase with the internal clock signal REF_CLK to be determined and continuously tracked. The term frozen state means a state in which the previously locked information is stored and the phase is not further updated. The power down mode period is in a range of minimally three clocks to maximally 7.8 us. If the clock enable signal CKE has a short period as shown in FIG. 3 and repeats the entry and exit into/from the power down mode frequently, problems may occur, as discussed below.

First, when the comparison result between the internal clock signal REF_CLK and the feedback clock signal FEEDBACK CLOCK is a logic level 'LOW', 'HIGH', and 'HIGH', respectively, as shown in the left portion of FIG. 3, it is impossible to compare the phases by a low pass filter of the DLL circuit. The low pass filter is designed to perform a phase update if three consecutive comparison results are the same, in order to prevent an erroneous operation of a phase detector of the DLL. Since the phase comparison is not performed soon after the onset of the power down mode, the feedback clock signal FEEDBACK CLOCK cannot keep up with the internal clock signal REF_CLK to complete the required phase update.

Second, it is difficult to secure a sufficient comparison time for comparing the internal clock signal REF_CLK and the feedback clock signal FEEDBACK CLOCK with each other if the duration time of a logic level 'HIGH' of the clock enable signal CKE is too short. An asynchronous delay value inevitably occurs because the DLL circuit is constructed as a closed loop. Since the comparison time is not sufficient, i.e., the internal clock signal REF_CLK is not being toggled when the phases of the internal clock signal REF_CLK and the feedback clock signal FEEDBACK CLOCK are being compared, the result of the phase detector always causes the erroneous operation of ordering to reduce the delay of the delay line.

Due to the foregoing reasons, the determined information for the DLL clock is inaccurate. As a result, if a bank is activated and a read operation is performed using the output clock of the DLL with the erroneous lock information, the output of the DRAM is distorted in comparison with the external clock so that it is difficult to transmit/receive the data normally.

SUMMARY OF THE INVENTION

It is, therefore, an object of the present invention to provide a delay locked loop (DLL) circuit of a semiconductor memory device for performing an accurate phase update even if an entry into and an exit from the power down mode are repeated frequently because of a short period of a clock enable signal, and a locking method thereof.

In accordance with an aspect of the present invention, there is provided a synchronous memory device having a normal mode and a power down mode, including: a delay locked loop (DLL), without performing a phase update operation in the power down mode, for generating a DLL clock having frozen locking information when exiting the power down mode; and a controller for stopping the phase update operation of the DLL when a predetermined time passes after entering the power down mode to thereby obtain a time margin for the phase update operation in the normal mode.

In accordance with another aspect of the present invention, there is provided a delay locked loop including: a power down mode controller for generating a first control signal which determines whether entering a power down mode or exiting the power down mode in response to a clock enable signal; a clock edge delay unit for receiving and delaying the first control signal when entering the power down mode and outputting the delayed first control signal as a second control signal; a clock buffer for buffering an external clock signal in response to the second control signal and outputting the buffered external clock signal as an internal clock signal; and a phase update unit for performing a phase update operation of the internal clock signal.

In accordance with a further aspect of the present invention, there is provided a synchronous memory device having a normal mode and a power down mode, including: a power down mode controller for generating a first control signal which determines whether entering a power down mode or exiting the power down mode in response to a clock enable signal; a clock edge delay unit for receiving the first control signal and delaying a corresponding clock edge of the first control signal when entering the power down mode, thereby outputting the delayed first control signal as a second control signal; a clock buffer for buffering an external clock signal in response to the second control signal, thereby outputting the buffered external clock signal as an internal clock signal; a delay line for delaying the internal clock signal to output a delayed internal clock signal; a phase comparator for receiving the internal clock signal and a feedback clock signal to detect phase difference therebetween; and a delay controller for receiving an output signal of the phase comparator to control a phase delay of the delay line.

In the present invention, if a time for updating a phase is too short after phases of the internal clock signal and the feedback clock signal are compared with each other after entering the power down mode, the time for the phase update may be lengthened according to the comparison result. Therefore, the internal clock signal and the feedback clock signal are synchronized with each other so that it is possible to prevent a normal data transmission from being degraded. To this end, a delay structure is needed to sense and delay an edge of a control signal clock output when entering the power down mode. To meet the need, there may be employed a clock edge delay unit in the present invention.

BRIEF DESCRIPTION OF THE DRAWINGS

The above and other objects and features of the present invention will become better understood with respect to the following description of the preferred embodiments given in conjunction with the accompanying drawings, in which:

FIG. 7 is a timing diagram for operation of the DLL shown in FIG. 4;

FIGS. 8A and 8B are graphs illustrating simulation results when applying the DLL of the related arts shown in FIG. 2 to a semiconductor memory device; and FIGS. 9A and 9B are graphs illustrating simulation results when applying the DLL of FIG. 4 to a semiconductor memory device in accordance with an embodiment of the present invention.

DETAILED DESCRIPTION OF THE INVENTION

A delay locked loop (DLL) circuit in accordance with exemplary embodiments of the present invention will be described in detail with reference to the accompanying drawings.

Figure 4:
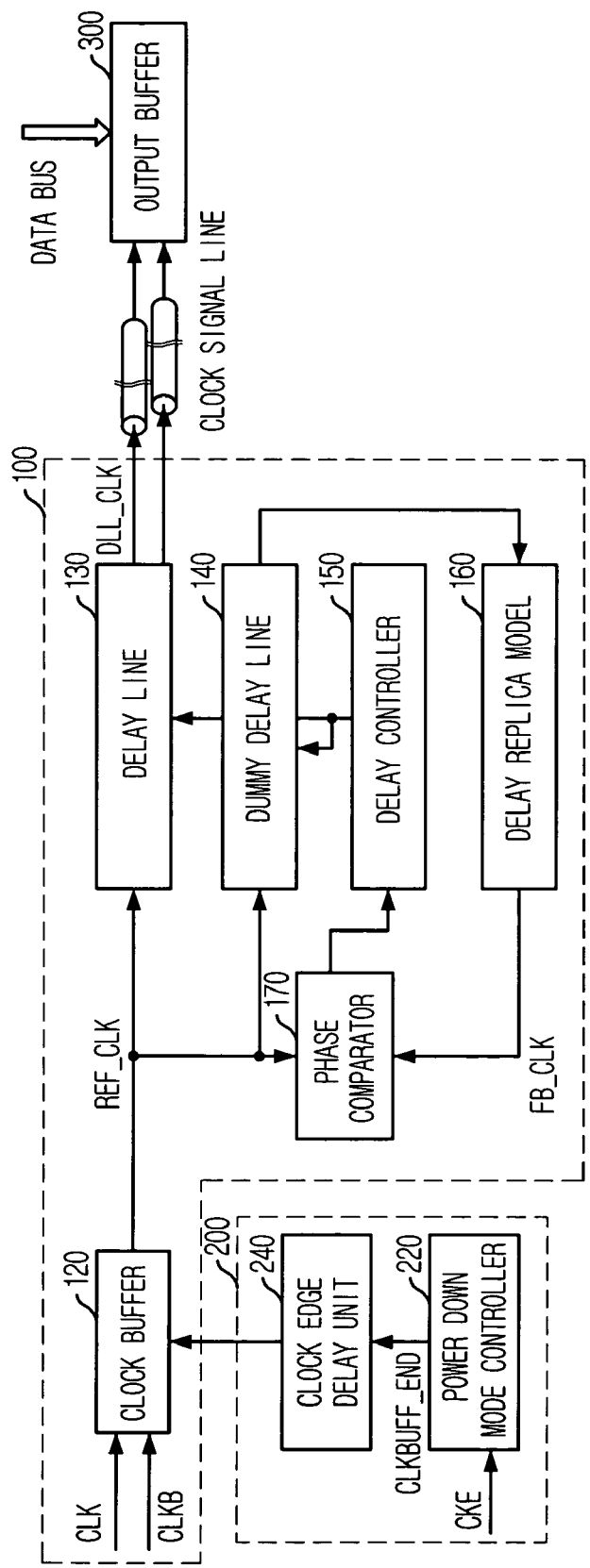
FIG. 4 is a block diagram of a DLL circuit in accordance with an embodiment of the present invention.

FIG. 4 is a block diagram illustrating a DLL circuit in accordance with an embodiment of the present invention.

The DLL circuit in accordance with the embodiment of the present invention which is employed in a synchronous memory device having a normal mode and a power down mode for low power consumption, includes a DLL 100 and a controller 200. The DLL 100 does not perform a phase update in the power down mode and generates a DLL clock having frozen locking information when exiting the power down mode. The controller 200 stops performing the phase update operation of the DLL when a predetermined time passes after entering the power down mode, to obtain a time margin for the phase update in the normal mode.

The controller 200 is configured with a power down mode controller 220 and a clock edge delay unit 240. The power down mode controller 220 generates a first control signal CLKBUFF_ENB which determines whether entering a power down mode or exiting the power down mode in response to a clock enable signal CKE. The clock edge delay unit 240 receives the first control signal CLKBUFF_ENB and delays a corresponding clock edge of the first control signal CLKBUFF_ENB when entering the power down mode, to output the delayed first control signal as a second control signal CLKBUFF_ENB_DELAY.

The DLL 100 is configured with a clock buffer 120 and phase update units 130 to 170. The clock buffer 120 receives an external clock signal CLK and an external clock bar signal CLKB and buffers them in response to the second control signal CLKBUFF_ENB_DELAY, to output the buffered external clock signal as an internal clock signal REF_CLK. Phase update units 130 to 170 perform a phase update operation of the internal clock signal REF_CLK.

An output clock CLK_DLL of the DLL 100 is transferred to an output buffer 300 through a clock signal line, and controls an output timing of a data of the output buffer 300.

Figure 5:
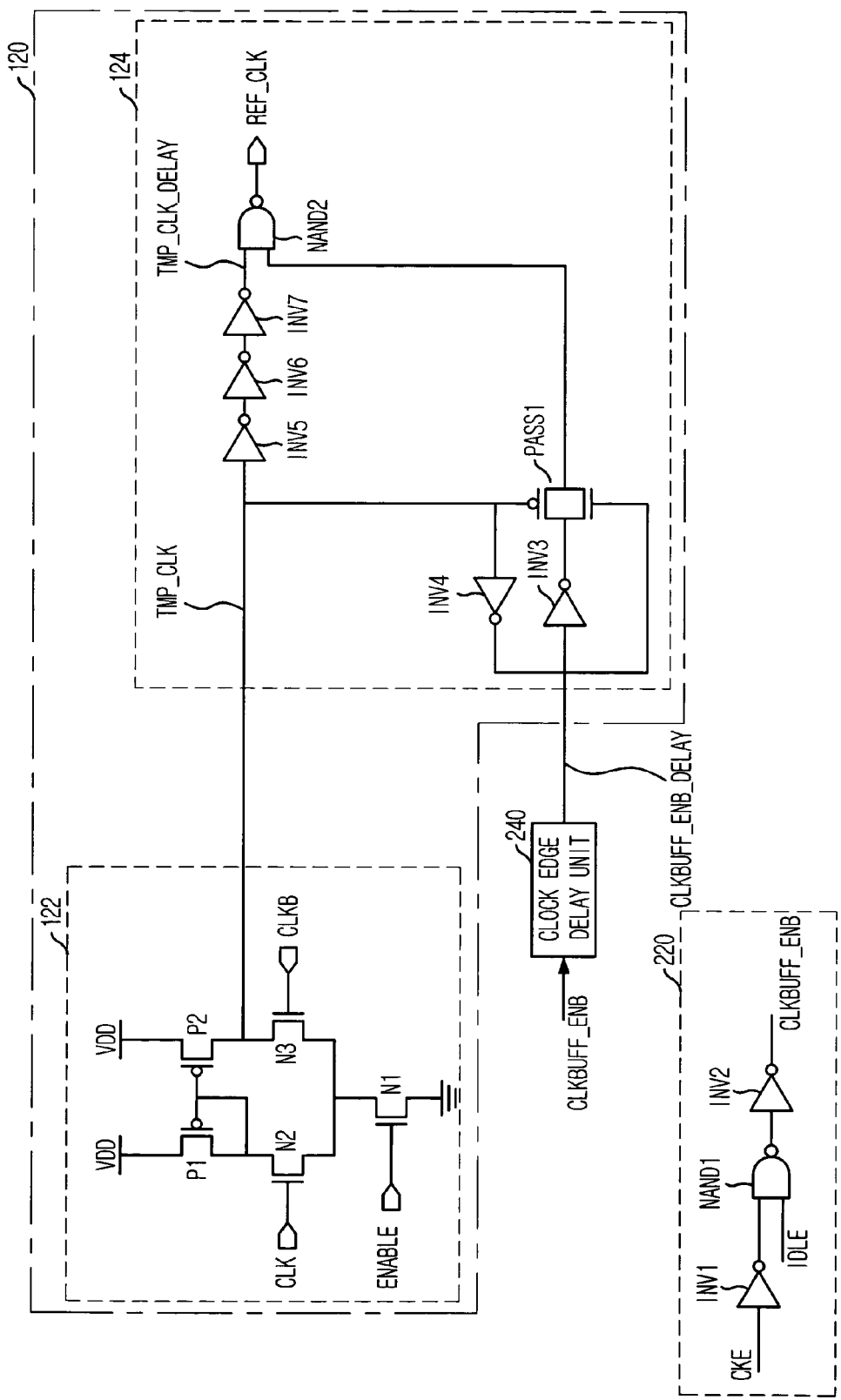
FIG. 5 is a detailed circuit diagram of a power down mode controller and a clock buffer shown in FIG. 4.

FIG. 5 is a detailed circuit diagram of the power down mode controller 220 and the clock buffer 120 shown in FIG. 4.

The power down mode controller 220 is includes a first inverter INV1 inverts the clock enable signal CKE, a first NAND gate NAND1 that receives an output signal of the first inverter INV1 and an idle signal IDLE having a phase opposite to that of the clock enable signal CKE in the power down mode, and a second inverter INV2 that inverts an output of the first NAND gate NAND1 to output the first control signal CLKBUFF_ENB.

The clock buffer 120 includes a differential amplifier 122 for comparing the external clock signal CLK with the external clock bar signal CLKB to amplify the compared result, and an output unit 124 for transferring an output of the differential amplifier 122 as the internal clock signal REF_CLK in response to the second control signal CLKBUFF_ENB_DELAY.

The differential amplifier 122 includes an enable NMOS transistor N1 for controlling an operation of the differential amplifier 122 in response to an enable signal ENABLE, input NMOS transistors N2 and N3 for controlling a temporary clock signal TMP_CLK of the differential amplifier 122 in response to the external clock signal CLK and the external clock bar signal CLKB, and output PMOS transistors P1 and P2 connected between a source voltage and a node of the temporary clock signal TMP_CLK for determining the temporary clock signal TMP_CLK according to the input NMOS transistors N2 and N3.

The output unit 124 includes a third inverter INV3 for receiving the second control signal CLKBUFF_ENB_DELAY to output an inverted second control signal, a fourth inverter INV4 for receiving the temporary clock signal TMP_CLK to output an inverted temporary clock signal, a transfer gate PASS1 for outputting the inverted second control signal in response to the temporary clock signal TMP_CLK and the inverted temporary clock signal, a plurality of fifth inverters INV5 to INV7 connected in series to each other, for receiving the temporary clock signal TMP_CLK and inverting it sequentially so as to output a delay temporary clock signal TMP_CLK_DELAY by a predetermined time, and a second NAND gate NAND2 for performing a logic NAND operation on the inverted second control signal and the delay temporary clock signal TMP_CLK_DELAY so as to output the internal clock signal REF_CLK.

Figure 6:
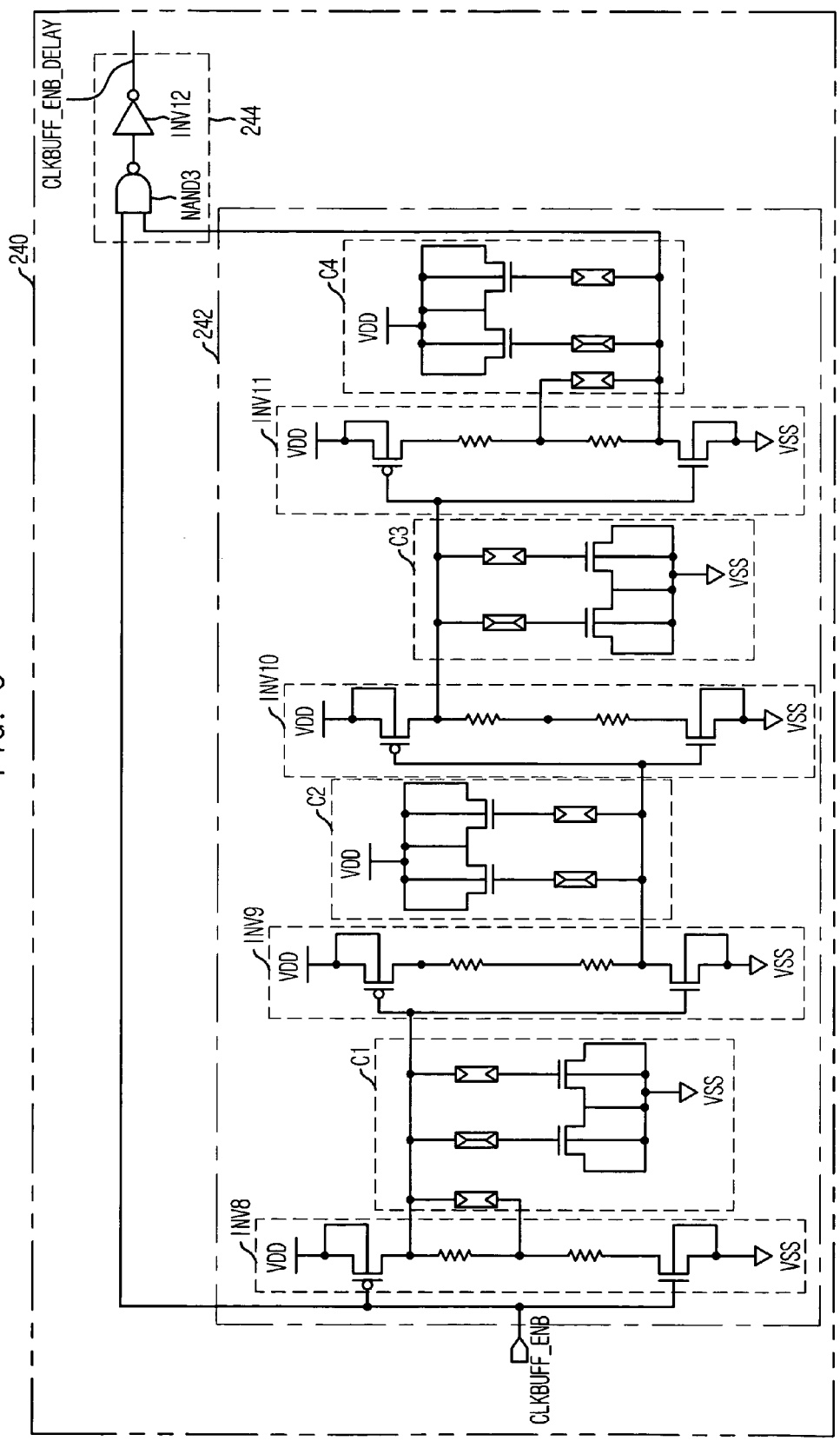
FIG. 6 is a detailed circuit diagram of a clock edge delay shown in FIG. 4.

FIG. 6 is a detailed circuit diagram of the clock edge delay unit 240 shown in FIG. 4.

As shown, the clock edge delay unit 240 is provided with a signal delay unit 242 for outputting a signal delayed by a predetermined time, which is in phase with the first control signal CLKBUFF_ENB, and a logic unit 244 for receiving an output signal of the signal delay unit 242 and the first control signal CLKBUFF_ENB to output the second control signal CLKBUFF_ENB_DELAY.

The signal delay unit 242 includes a plurality of first inverters INV8, INV9, INV10 and INV11 which are connected in series, and a plurality of capacitors C1, C2, C3 and C4 connected between the respective inverters INV8, INV9, INV10 and INV11.

The logic unit 244 includes a NAND gate NAND3 for receiving the output signal of the signal delay unit 242 and the first control signal CLKBUFF_ENB, and a second inverter INV12 for inverting an output of the NAND gate NAND3 so as to output the second control signal CLKBUFF_ENB_DELAY.

Waveforms of various signals will be illustrated with reference to FIGS. 5 and 6 herebelow.

When entering the power down mode, the first control signal CLKBUFF_ENB, which is a flag signal indicating a current status by the power down mode controller 220, is transitioned to a logic level 'HIGH'. Thereafter, the clock edge delay unit 240 receives the first control signal CLKBUFF_ENB to delay a rising edge of the received signal, i.e., the first control signal CLKBUFF_ENB. Accordingly, it is possible to secure a time to update the phase of the DLL as much as the delay amount of the first control signal CLKBUFF_ENB.

Afterwards, when the second control signal CLKBUFF_ENB_DELAY is input to the clock buffer 120, the internal clock signal REF_CLK, i.e., an output signal of the clock buffer 120, is transitioned from a first logic level (high level) to a second logic level (low level) so that the power down mode operation is performed.

When exiting the power down mode, an output signal of the power down mode controller 220, i.e., the first control signal CLKBUFF_ENB, becomes the second logic level (low level), and enables the clock buffer 120 rapidly while passing through the clock edge delay unit 240. When the first control signal CLKBUFF_ENB is transitioned to the second logic level (low level), the clock edge delay unit 240 delays a rising edge of the first control signal CLKBUFF_ENB in order to enable the clock buffer 120 fast. If the phase of the first control signal CLKBUFF_ENB is opposite to the above, the clock edge delay unit 240 should be designed such that it delays a falling edge of the first control signal CLKBUFF_ENB.

FIG. 7 is a timing diagram for operation of the DLL shown in FIG. 4.

As shown, when the clock enable signal CKE repeats its periodic pattern such that it maintains the first level for three clocks after exiting the power down mode and subsequently enters the power down mode again, the rising edge of the first control signal CLKBUFF_ENB is delayed to secure a time enough to update the phase.

Therefore, since it is sufficient for updating the phase, a feedback clock signal FEEDBACK CLOCK is compared with the internal clock signal REF_CLK and the distortion amount is accurately sensed, and then, the internal clock signal REF_CLK is tracked. In addition, when entering the power down mode for a long time for storing the current state of the power down state, the first control signal CLKBUFF_ENB is maintained in the first logic level so that the low power operation is possible.

Figure 1:
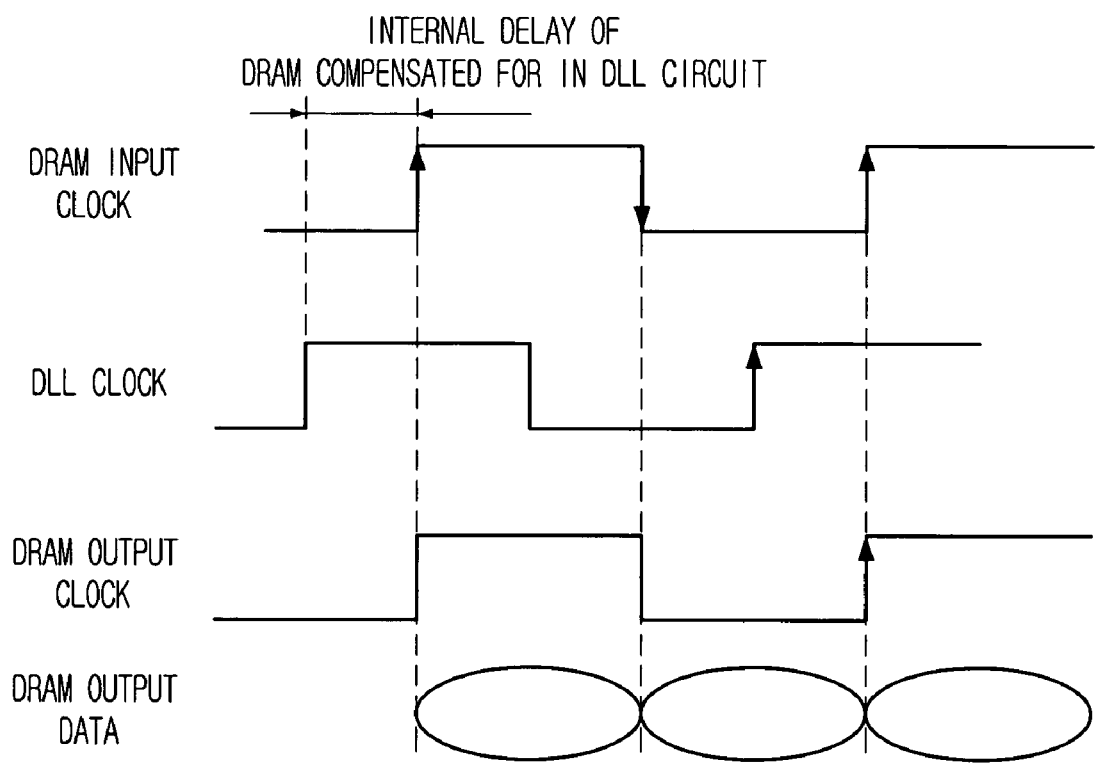
FIG. 1 is a conceptual view illustrating a basic operation of a general delay locked loop (DLL)
Figure 2:
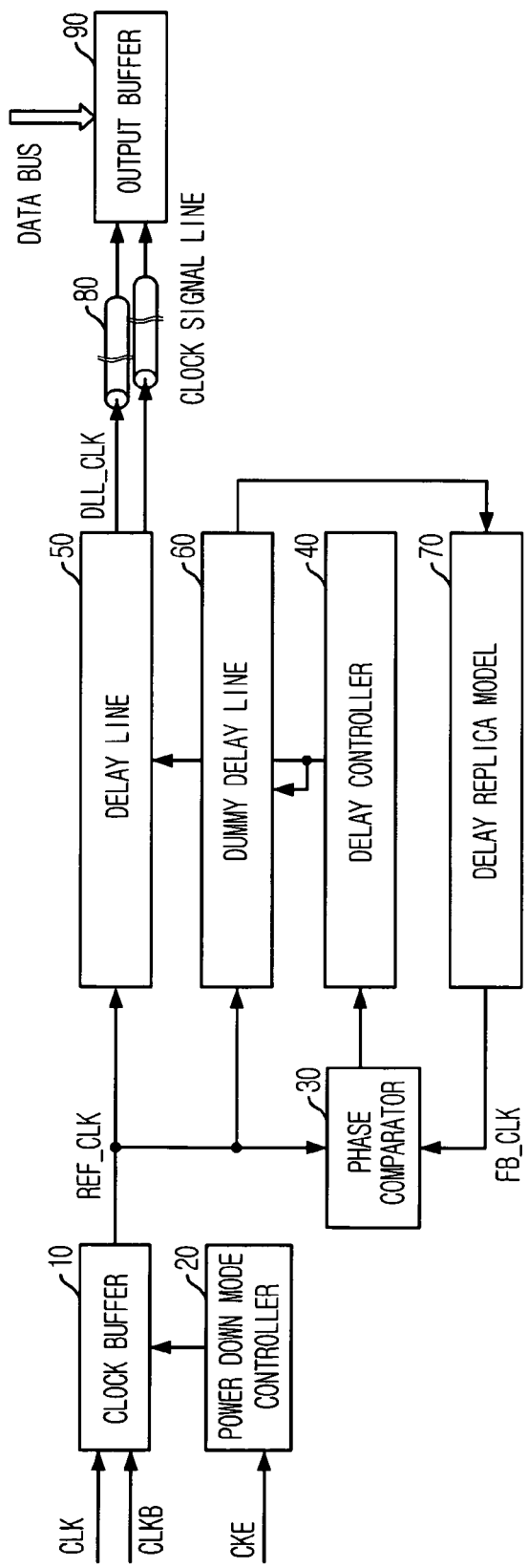
FIG. 2 is a block diagram of a DLL circuit.
Figure 3:
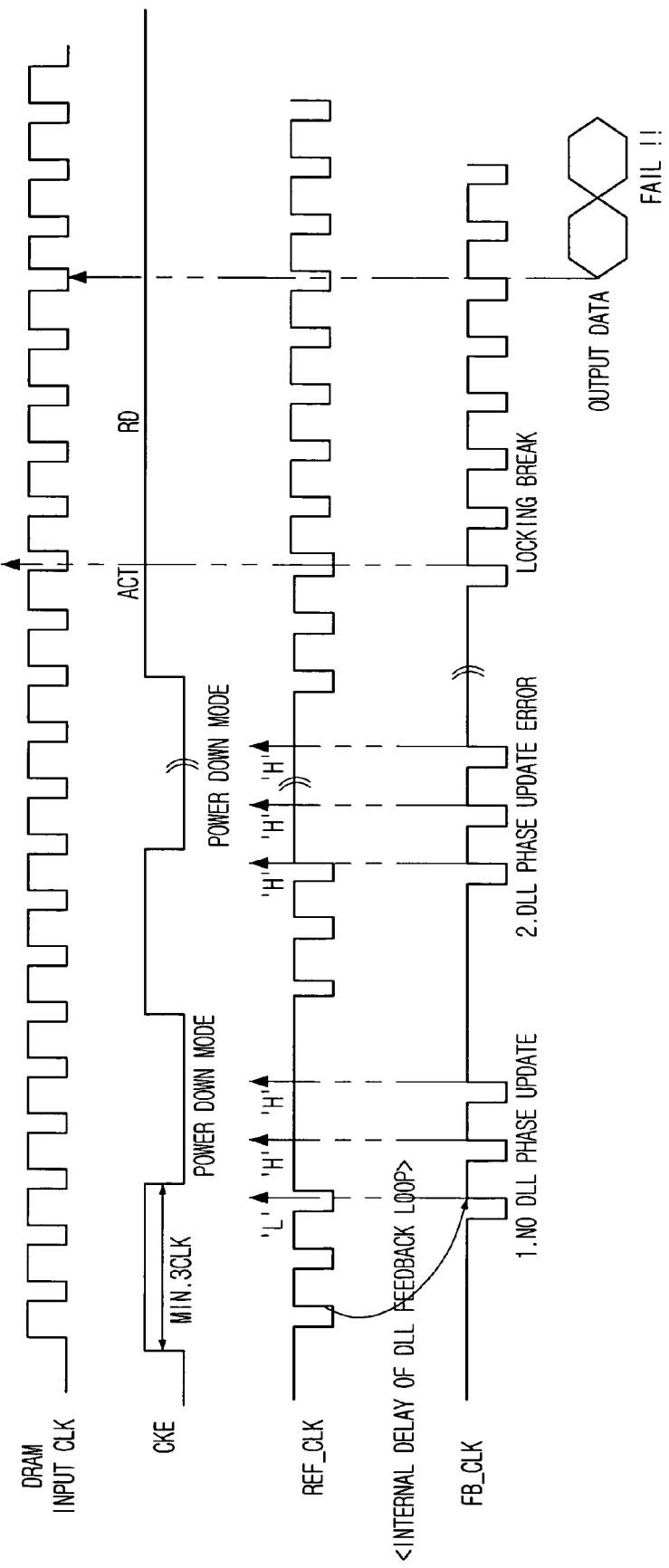
FIG. 3 is a timing diagram for operation of the DLL of FIG. 2.
Figure 8A:
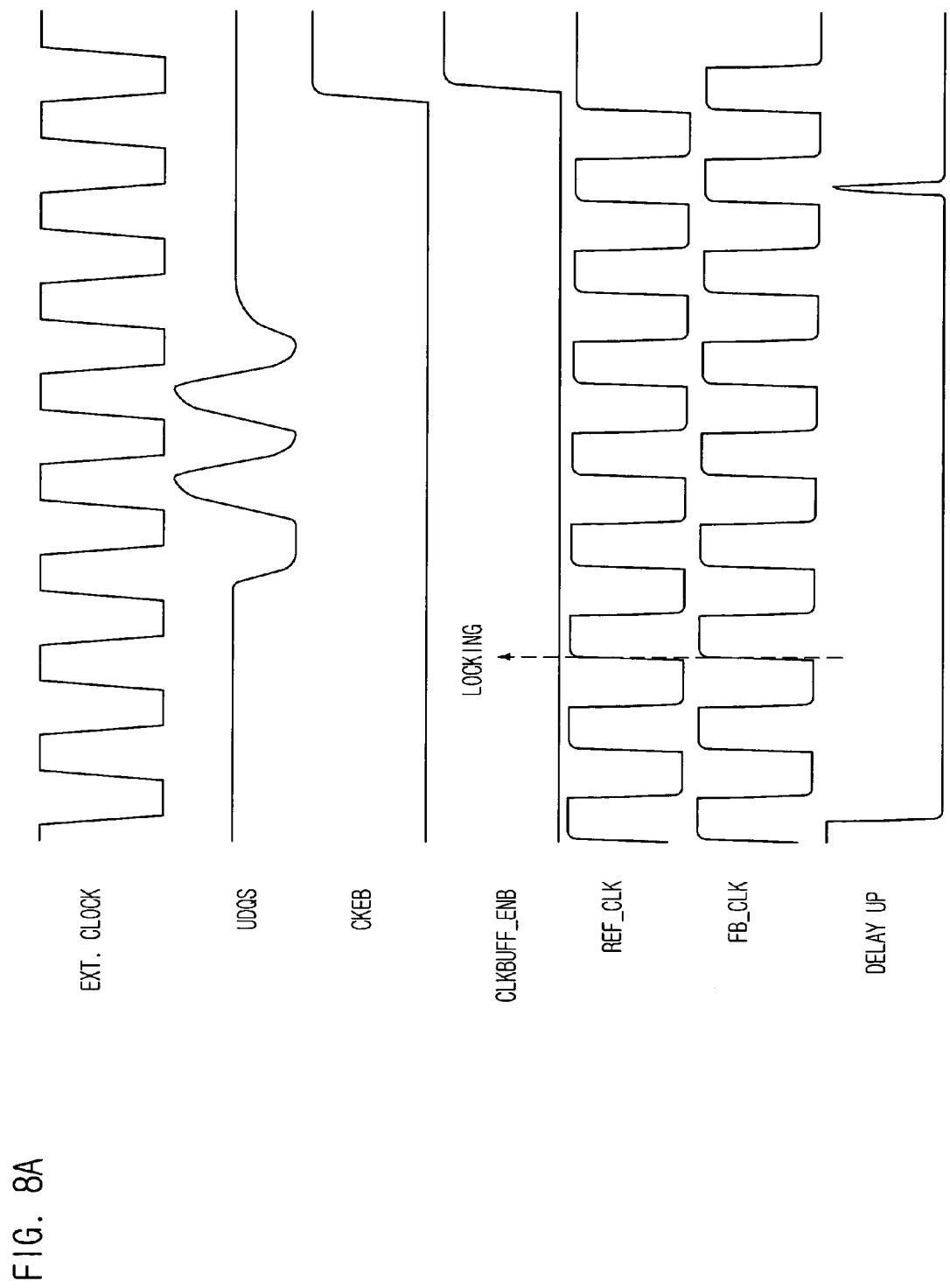

FIGS. 8A and 8B are graphs illustrating simulation results when applying the DLL of the related arts shown in FIG. 2 to a semiconductor memory device.

FIG. 8A illustrates the simulation result of a read operation in an active state after completing an initial locking operation.

As shown, a strobe output signal UDQS has 110 ps skew in comparison with the external clock signal CLK, wherein the strobe output signal UDQS is a strobe output signal of the DRAM.

FIG. 8B shows the simulation result of a read operation in an active state after a frequent power down mode operation is repeated for 3 us, in which the clock enable signal CKE has very short period.

As shown, it can be understood that the strobe output signal UDQS is distorted by about 700 ps in comparison with the external clock signal CLK.

Figure 9B:
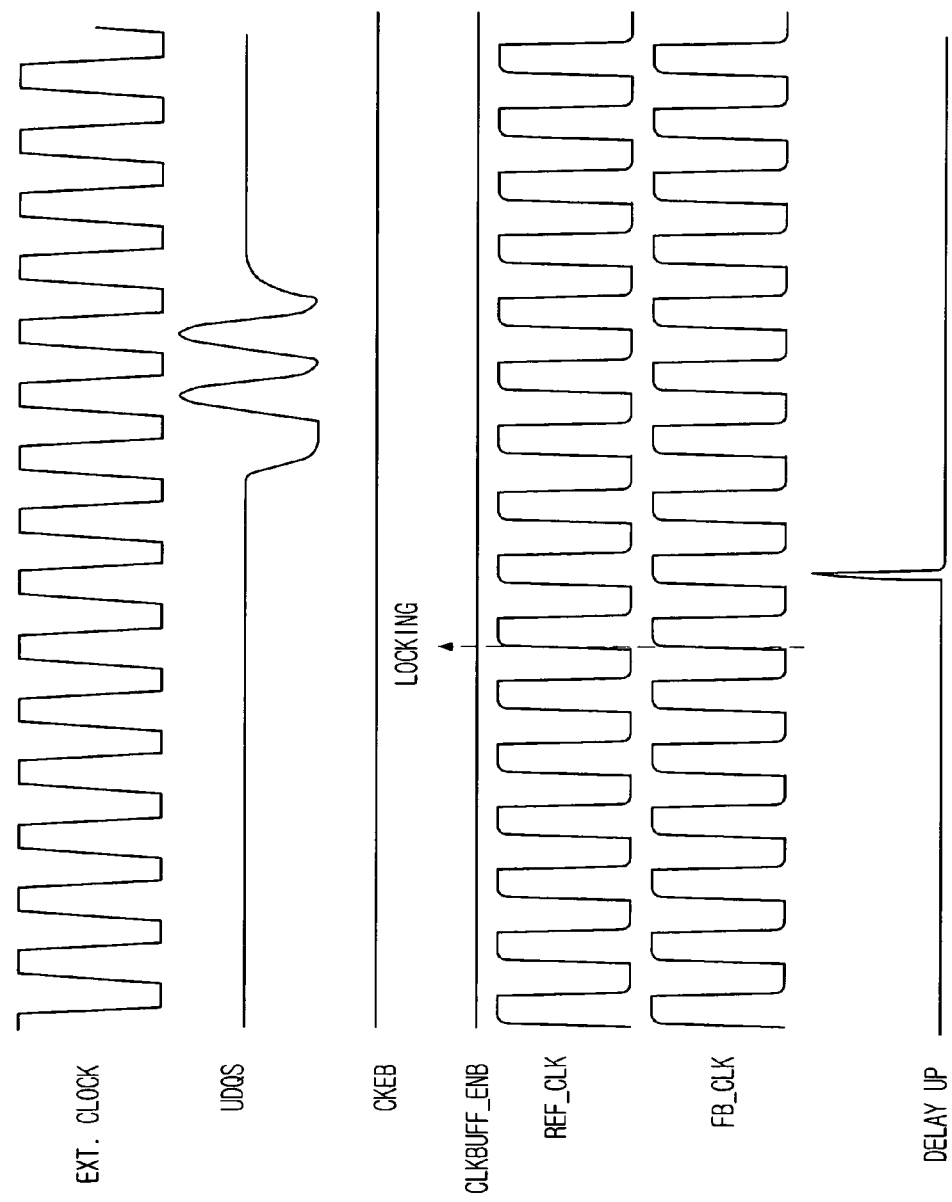

FIGS. 9A and 9B are graphs illustrating simulation results when applying the inventive DLL of FIG. 4 to a semiconductor memory device in accordance with the present invention.

FIGS. 9A and 9B represent the simulation results when the same pattern as illustrated in FIGS. 8A and 8B is applied to the DLL circuit of the embodiment of the present invention. The experimental conditions of FIGS. 9A and 9B are identical those of FIGS. 8A and 8B, respectively.

As shown, the strobe output signal UDQS signal has an error of 103 ps before the entry into the power down mode. When the read operation is again performed in the active state after the lapse of 3 us, the strobe output signal UDQS signal has an error of 105 ps in comparison with the external clock signal CLK.

In accordance with the present invention, when the entry and exit into/from the power down mode is repeated rapidly in such a manner that the phase update is performed within a short time after exiting the power down mode, and, thereafter, the memory device enters the power down mode again, an operational error in updating the phase is prevented in advance. Therefore, DLL locking fail is effectively prevented so that the DLL circuit operates more stably.

The present application contains subject matter related to the Korean patent application Nos. KR 2005-91671 & 2005-117122, filed in the Korean Patent Office on Sep. 29, 2005 & Dec. 02, 2005, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A synchronous memory device having a normal mode of operation and a power down mode of operation, comprising:
   a delay locked loop (DLL) for generating a DLL clock having frozen locking information when exiting the power down mode; and
   a controller for precluding phase update operation of the DLL when a predetermined time passes after entering the power down mode to thereby obtain a time margin for a phase update operation undertaken in the normal mode.

2. The synchronous memory device as recited in claim 1, wherein the DLL includes a clock buffer for generating an internal clock by buffering an external clock, thereby performing the phase update operation based on the internal clock.

3. The synchronous memory device as recited in claim 2, wherein the controller controls driving of the clock buffer.

4. A delay locked loop, comprising:
   a power down mode controller for generating a first control signal which determines onset and termination of a power down mode in response to a clock enable signal;
   a clock edge delay unit for receiving and delaying the first control signal when entering the power down mode and outputting the delayed first control signal as a second control signal;
   a clock buffer for buffering an external clock signal in response to the second control signal and outputting the buffered external clock signal as an internal clock signal; and
   a phase update unit for performing a phase update operation of the internal clock signal.

5. The DLL as recited in claim 4, wherein the clock edge delay unit delays a clock edge of the first control signal when entering the power down mode.

6. The DLL as recited in claim 4, wherein the clock edge delay unit outputs the second control signal without delaying the first control signal when exiting the power down mode.

7. The DLL as recited in claim 4, wherein the clock edge delay unit includes:

a signal delay unit for outputting a signal delayed by a predetermined time based on the first control signal, which is in phase with the first control signal; and a logic unit for receiving an output signal of the signal delay unit and the first control signal to output the second control signal.

8. The DLL as recited in claim 7, wherein the signal delay unit includes:

a plurality of inverters connected in series; and a plurality of capacitors connected between the respective inverters.

9. The DLL as recited in claim 7, wherein the logic unit includes:

a NAND gate for receiving the output signal of the signal delay unit and the first control signal; and an inverter for inverting an output signal of the NAND gate and outputting the inverted signal as the second control signal.

10. The DLL as recited in claim 4, wherein the power down mode controller receives the clock enable signal to output the first control signal with a first logic level when entering the power down mode and to output the first control signal with a second logic level when exiting the power down mode.

11. The DLL as recited in claim 10, wherein the power down mode controller includes:

a first inverter for inverting the clock enable signal;

a NAND gate for receiving an output signal of the first inverter and an idle signal of which a phase is opposite to that of the clock enable signal in the power down mode; and a second inverter for inverting an output signal of the NAND gate and outputting the inverted signal as the first control signal.

12. The DLL as recited in claim 4, wherein the clock buffer includes:

a differential amplifier for amplifying a voltage difference between the external clock signal and an inverted external clock signal; and an output unit for outputting the internal clock signal based on an output signal of the differential amplifier and the second control signal.

13. The DLL as recited in claim 12, wherein the output unit includes:

a first inverter for inverting the second control signal to output an inverted second control signal;

a second inverter for inverting the output signal of the differential amplifier to output an inverted output signal;

a transfer gate for transferring the inverted second control signal in response to the output signal of the differential amplifier and the inverted output signal of the second inverter;

an inverter chain having a plurality of inverters connected in series, for inverting the output signal of the differential amplifier to output a signal delayed by a predetermined time; and a NAND gate for performing a logic NAND operation of the inverted second control signal and an output signal of the inverter chain, thereby outputting the internal clock signal.

14. The DLL as recited in claim 4, wherein the phase update unit includes:

a delay line for delaying the internal clock signal to output a delayed internal clock signal;

a dummy delay line having a constitution which is substantially the same as that of the delay line;

a delay replica model for modeling an output signal of the dummy delay line as delay factors of a clock signal in a memory device, thereby outputting a feedback clock signal;

a phase comparator for receiving the internal clock signal and the feedback clock signal to detect phase difference therebetween; and a delay controller for receiving an output signal of the phase comparator to control phase delays of the delay line and the dummy delay line.

15. A synchronous memory device having a normal mode and a power down mode, comprising:

a power down mode controller for generating a first control signal which determines onset and termination of a power down mode in response to a clock enable signal;

a clock edge delay unit for receiving the first control signal and delaying a corresponding clock edge of the first control signal when entering the power down mode, thereby outputting the delayed first control signal as a second control signal;

a clock buffer for buffering an external clock signal in response to the second control signal, thereby outputting the buffered external clock signal as an internal clock signal;

a delay line for delaying the internal clock signal to output a delayed internal clock signal;

a phase comparator for receiving the internal clock signal and a feedback clock signal to detect phase difference therebetween; and a delay controller for receiving an output signal of the phase comparator to control a phase delay of the delay line.

16. The synchronous memory device as recited in claim 15, further comprising:

a dummy delay line having a constitution which is substantially identical to that of the delay line; and a delay replica model for modeling an output signal of the dummy delay line as delay factors of the clock signal in the memory device, thereby outputting the feedback clock signal.

17. The synchronous memory device as recited in claim 15, wherein the clock edge delay unit includes:

a signal delay unit for outputting a signal delayed by a predetermined time based on the first control signal, which is in phase with the first control signal; and a logic unit for receiving an output signal of the signal delay unit and the first control signal to output the second control signal.

18. The synchronous memory device as recited in claim 15, wherein the power down mode controller includes:

a first inverter for inverting the clock enable signal;

a NAND gate for receiving an output signal of the first inverter and an idle signal of which a phase is opposite to that of the clock enable signal in the power down mode; and a second inverter for inverting an output signal of the NAND gate to output the inverted signal as the first control signal.

19. The synchronous memory device as recited in claim 15, wherein the clock buffer includes:

a differential amplifier for amplifying a voltage difference between the external clock signal and an inverted external clock signal; and an output unit for outputting the internal clock signal based on an output signal of the differential amplifier and the second control signal.

20. The synchronous memory device as recited in claim 19, wherein the output unit includes:
- a first inverter for inverting the second control signal to output an inverted second control signal;
- a second inverter for inverting the output signal of the differential amplifier to output an inverted output signal;
- a transfer gate for transferring the inverted second control signal in response to the output signal of the differential amplifier and the inverted output signal of the second inverter;
- an inverter chain having a plurality of inverters connected in series, for inverting the output signal of the differential amplifier to output a signal delayed by a predetermined time; and
- a NAND gate for performing a logic NAND operation of the inverted second control signal and an output signal of the inverter chain, thereby outputting the internal clock signal.

* * * * *